United States Patent
Nasu

(10) Patent No.: US 11,249,109 B2
(45) Date of Patent: Feb. 15, 2022

(54) ELECTRIC CONNECTION DEVICE

(71) Applicant: Kabushiki Kaisha Nihon Micronics, Tokyo (JP)

(72) Inventor: Mika Nasu, Oita (JP)

(73) Assignee: Kabushiki Kaisha Nihon Micronics, Musashino (JP)

( * ) Notice: Subject to any disclaimer, the term of this patent is extended or adjusted under 35 U.S.C. 154(b) by 0 days.

(21) Appl. No.: 16/757,292

(22) PCT Filed: Aug. 3, 2018

(86) PCT No.: PCT/JP2018/029191
§ 371 (c)(1),
(2) Date: Apr. 17, 2020

(87) PCT Pub. No.: WO2019/077849
PCT Pub. Date: Apr. 25, 2019

(65) Prior Publication Data
US 2020/0300892 A1    Sep. 24, 2020

(30) Foreign Application Priority Data

Oct. 19, 2017 (JP) .............................. JP2017-202399

(51) Int. Cl.
*G01R 1/067* (2006.01)
*G01R 1/073* (2006.01)

(52) U.S. Cl.
CPC ..... *G01R 1/06722* (2013.01); *G01R 1/07307* (2013.01)

(58) Field of Classification Search
CPC ........................ G01R 1/06722; G01R 1/07307
See application file for complete search history.

(56) References Cited

U.S. PATENT DOCUMENTS 6,685,492 B2    2/2004  Winter et al.
10,359,447 B2   7/2019  Breinlinger et al.

FOREIGN PATENT DOCUMENTS

JP    S61129166 U    8/1986
JP    S61-193377 U   12/1986
(Continued)

OTHER PUBLICATIONS

JP 2010-281583 A English translation (Year: 2010).*

*Primary Examiner* — Paresh Patel
(74) *Attorney, Agent, or Firm* — Lorenz & Kopf, LLP

(57) ABSTRACT

An electric connection device includes a probe (10) and a probe head (20). The probe (10) includes: a tubular barrel (11), a rod-like top-side plunger (121), and a rod-like bottom-side plunger (122). The top- and bottom-side plungers are connected to the barrel (11) with tips thereof exposed from respective open ends of the barrel (11). The probe head (2) includes guide plates (211 and 212) which are spaced apart from each other in the axial direction of the probe (10) and each include a through-hole through which a body of the barrel (11) penetrates. A protrusion (13) having an outer diameter greater than the body of the barrel (11) is provided on the circumference of the probe (10). The guide plates (211 and 212) include a support guide plate in which the through-hole has a diameter smaller than the outer diameter of the protrusion (13). The probe (10) is supported by the support guide plate with the top-side plunger (121) up such that the lower section of the protrusion (13) is in contact with the edge of the upper opening of the through-hole of the support guide plate.

7 Claims, 8 Drawing Sheets

(56) References Cited

FOREIGN PATENT DOCUMENTS

| | | | |
|---|---|---|---|
| JP | H06289052 A | | 10/1994 |
| JP | 2006208329 A | | 8/2006 |
| JP | 2007285882 A | * | 11/2007 |
| JP | 2010281583 A | | 12/2010 |
| JP | 2010281601 A | * | 12/2010 |
| JP | 2010281790 A | | 12/2010 |
| JP | 2011089918 A | * | 5/2011 |
| JP | 2016166783 A | | 9/2016 |
| JP | 2017096646 | | 6/2017 |
| KR | 20100010780 A | | 2/2010 |
| TW | 200301592 A | | 7/2003 |
| TW | 201423112 A | | 6/2014 |
| WO | WO-2019039233 A1 | * | 2/2019 ............. G01R 1/067 |

* cited by examiner

ELECTRIC CONNECTION DEVICE

TECHNICAL FIELD

The present invention relates to an electric connection device used for measuring characteristics of an inspection subject.

BACKGROUND ART

Measuring characteristics of an inspection subject, such as an integrated circuit, uses an electric connection device which is brought into contact with the inspection subject. In such measurement using the electric connection device, an end of a probe contacts with the inspection subject while the other end contacts with a terminal (hereinafter, referred to as a land) which is provided on a substrate and electrically connects to a tester.

In order to hold the probe, a probe head is used. The probe head includes a plurality of guide plates arranged in the axial direction of the probe. The probe penetrates through through-holes provided for the respective guide plates and is thereby held by the probe head (see Patent Literature 1, for example).

CITATION LIST

Patent Literature

PTL 1 Japanese Patent Laid-open Publication No. 2010-281583

SUMMARY OF INVENTION

Technical Problem

The cost for manufacturing the electric connection device increases with the number of guide plates of the probe head. The cost for forming the through-holes in the guide plates increases with the number of probes. When the electric connection device includes a large number of probes, therefore, the manufacturing cost especially increases with the number of guide plates of the probe head.

In the light of the aforementioned problem, an object of the present invention is to provide an electric connection device with the number of guide plates of the probe head reduced.

Solution to Problem

According to an aspect of the present invention, an electric connection device is provided which includes: a probe including: a tubular barrel; a rod-like top-side plunger; and a rod-like bottom-side plunger, the top- and bottom-side plungers being connected to the barrel with tips thereof exposed from respective open ends of the barrel; a probe head including a plurality of guide plates which are spaced apart from each other in the axial direction of the probe and each include a through-hole through which a body of the barrel penetrates. A protrusion having an outer diameter greater than the body of the barrel is provided on the circumference of the probe, the plurality of guide plates include a support guide plate in which the through-hole has a diameter smaller than the outer diameter of the protrusion, and the probe is supported by the support guide plate with the top-side plunger up such that a lower section of the protrusion is in contact with an edge of an upper opening of the through-hole of the support guide plate.

Advantageous Effects of Invention

According to the present invention, it is possible to provide an electric connection device with the number of guide plates of the probe head reduced.

DESCRIPTION OF EMBODIMENT

Figure 1:
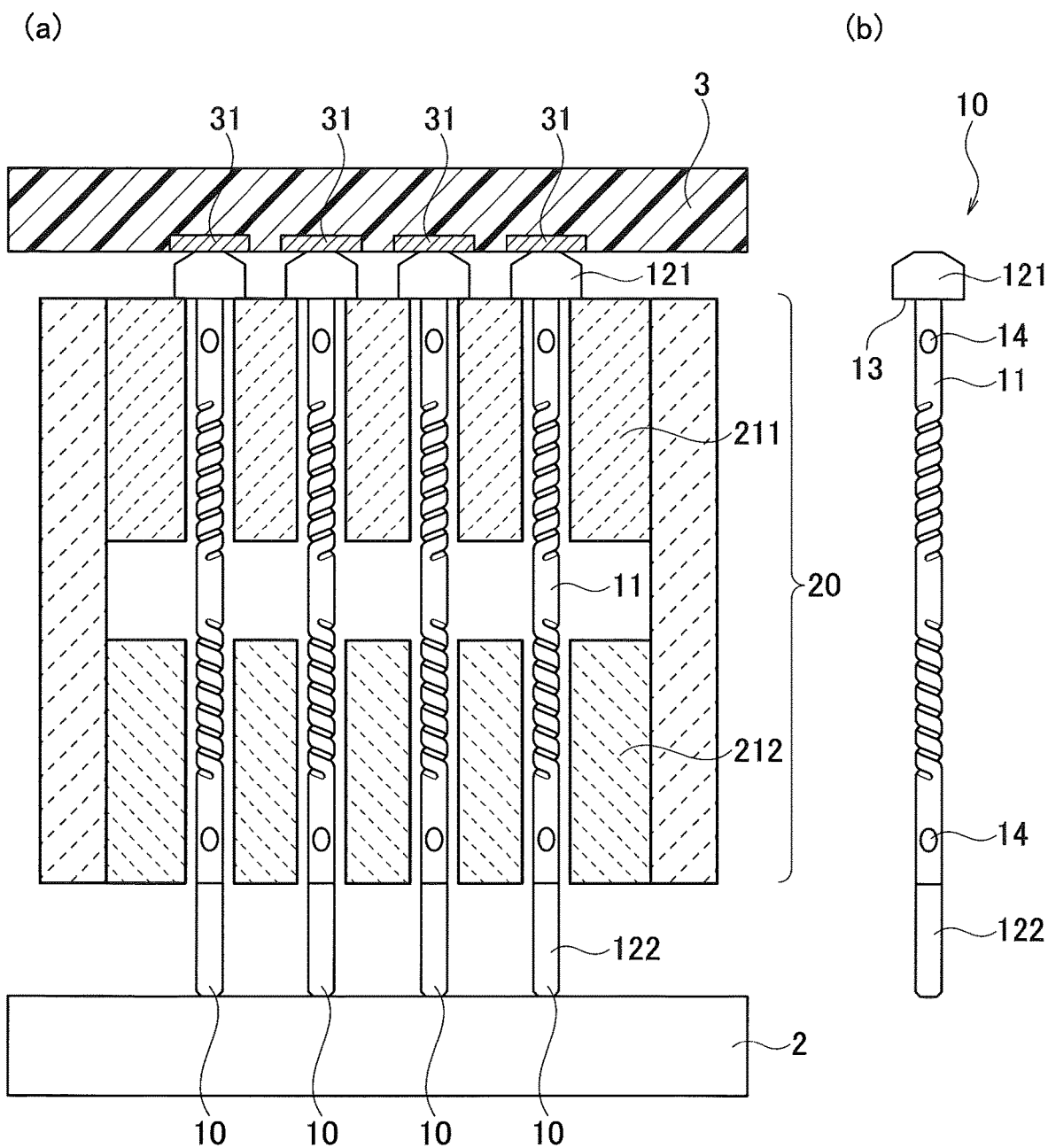
FIGS. 1(a) and 1(b) are schematic views illustrating the configuration of an electric connection device according to a first embodiment of the present invention, FIG. 1(a) illustrating the entire configuration of the electric connection device, FIG. 1(b) illustrating the configuration of a probe.

Hereinafter, a description is given of embodiments of the present invention with reference to the drawings. In the following description, the same or similar portions are given the same or similar reference numerals. The drawings are schematic, and it should be noted that thickness proportions of sections and the like are different from real ones. It is also obvious that dimensional relationship or proportions of some sections are different from each other across the drawings. The embodiments of the present invention will not limit the materials, shapes, structures, arrangements, and the other properties of the constituent components to those described below.

First Embodiment

An electric connection device according to a first embodiment of the present invention includes: probes 10; and a probe head 20 holding the probes 10 as illustrated in FIG. 1(a). An end of each probe 10 comes into contact with any land 31 provided in a substrate 3, and the other end comes into contact with an inspection subject 2. FIG. 1(a) illustrates a state where the probes 10 are in contact with the inspection subject 2. Before or after inspection, a stage (not illustrated) on which the inspection subject 2 is placed is moved down, and the probes 10 are not in contact with the inspection subject 2. The lands 31 electrically connect to an inspection device, such as a tester, and the electric connection device is thereby used to determine the electric characteristics of the inspection subject 2.

Each probe 10 includes a tubular barrel 11, a rod-like top-side plunger 121, and a rod-like bottom-side plunger 122 as illustrated in FIG. 1(b). The top- and bottom-side plungers 121 and 122 are connected to the barrel 11 with the tips thereof exposed from respective open ends of the barrel 11. The top- and bottom-side plungers 121 and 122 are connected to the barrel 11 at joints 14 located in sections inserted within the barrel 11.

The top- and bottom-side plungers 121 and 122 and the barrel 11 may be spot welded or may be bonded with an adhesive material. The probes 10, which electrically connect the lands 31 and the inspection subject 2, are made of conductive materials. For example, the barrel 11 is made of an Ni material, and the top- and bottom-side plungers 121 and 122 are made of an AgPdCu material or the like.

In order for the probe head 20 to hold each probe 10, a protrusion 13 is provided on the circumference of the probe 10 as described in detail later. The protrusion 13 has an outer diameter greater than that of the body of the barrel 11. In the probe 10 illustrated in FIG. 1(b), the protrusion 13 is located at the tip of the top-side plunger 121. The tip of the top-side plunger 121 thus serves as the protrusion 13. The body of the barrel 11 refers to a section of the barrel 11 which is other than the protrusion 13 and is substantially consistent in outer diameter.

The probe head 20 includes plural guide plates which are spaced apart from each other in the axial direction of the probes 10. Each guide plate includes through-holes through which the bodies of the barrels 11 penetrate. The probe head 20 illustrated in FIG. 1(a) includes a guide plate 211 and a guide plate 212. The sections of the respective barrels 11 in which the top-side plungers 121 are inserted penetrate through the through-holes of the guide plate 211. The sections of the respective barrels 11 in which the bottom-side plungers 121 are inserted penetrate through the through-holes of the guide plate 212. The probe head 20 is made of an insulating material, and examples thereof include ceramic.

The plural guide plates of the probe head 20 include a support guide plate in which the through-holes have diameters smaller than the outer diameters of the protrusions 13 of the probes 10. The support guide plate supports each probe 10 with the top-side plunger 121 up such that the lower section of the protrusion 13 of the probe 10 is in contact with the edge of the upper opening of any through-hole of the support guide plate.

In the electric connection device illustrated in FIG. 1(a), the guide plate 211 serves as the support guide plate. The diameters of the through-holes of the guide plate 211 are smaller than the maximum outer diameters of the tips of the respective top-side plungers 121. The lower side of the tip of each top-side plunger 121 is thereby in contact with the edge of the upper opening of the corresponding through-hole of the guide plate 211.

As described above, each probe 10 is supported by the probe head 20 with the protrusion 13 caught on the edge of the upper opening of the corresponding through-hole of the support guide plate. The probe 10 is supported only by the support guide plate, and the lower end of the barrel 11 is not supported by the probe head 20 from below. In the electric connection device illustrated in FIG. 1(a), the probes 10 hang within the probe head 20 with the top-side plungers 121 caught on the support guide plate. The probes 10 are thus supported substantially vertically with the top-side plungers 121 up.

Figure 2:
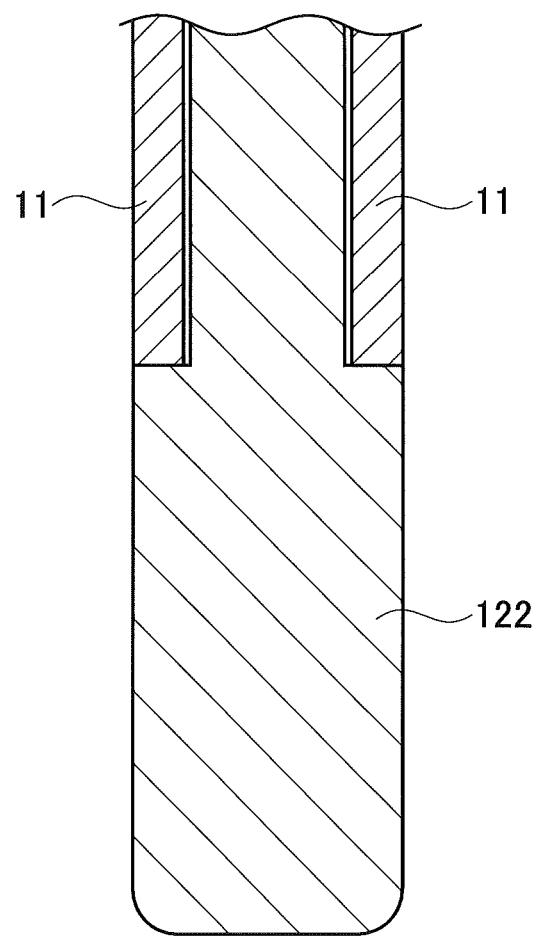
FIG. 2 is a schematic view illustrating the configuration of a bottom-side plunger of the electric connection device according to the first embodiment of the present invention.

In each probe 10, the outer diameter of the tip of the bottom-side plunger 122 is equal to the outer diameter of the body of the barrel 11. As illustrated in FIG. 2, the outer diameter of the tip of the bottom-side plunger 122 which is exposed to the outside of the barrel 11 is greater than that of the section of the bottom-side plunger 122 inserted within the barrel 11. By making the tip of the bottom-side plunger 122 thick in such a manner, the tip of the bottom side plunger 122, which is subject to stress when the probe 10 is pressed against the inspection subject 2, is strengthened. In addition, when the tip of the bottom-side plunger 122 is made thick, the tip can come into contact with a measurement pad of the inspection subject 2 even if the position of the probe 10 is misaligned slightly. It is therefore possible to relax the standards on positional accuracy of the probes 10.

The probes 10 need to ensure electric connection with the inspection subject 2 and lands 31. For this purpose, applying overdrive (OD) to strongly press the probes 10 against the inspection subject 2 and applying preload across the probes 10 and lands 31 are effective.

The probes 10 are therefore configured to freely expand and compress in the axial direction. Specifically, as illustrated in FIG. 1(b), the barrel 11 includes spiral cuts that penetrate the sidewall of the barrel 11. The regions including the cuts serve as spring sections, so that the probes 10 freely expand and compress in the axial direction. By providing the spring sections in each probe 10, the applied OD and preload can be consistent in magnitude.

Hereinafter, the spring section close to the open end of the barrel 11 from which the tip of the top-side plunger 121 is exposed is referred to as a top-side spring section. The spring section close to the open end of the barrel 11 from which the tip of the bottom-side plunger 122 is exposed is referred to as a bottom-side spring section. For easy understanding of the drawing, the sections of the top- and bottom-side plungers 121 and 122 inserted within the barrel 11 are not illustrated.

Figure 3:
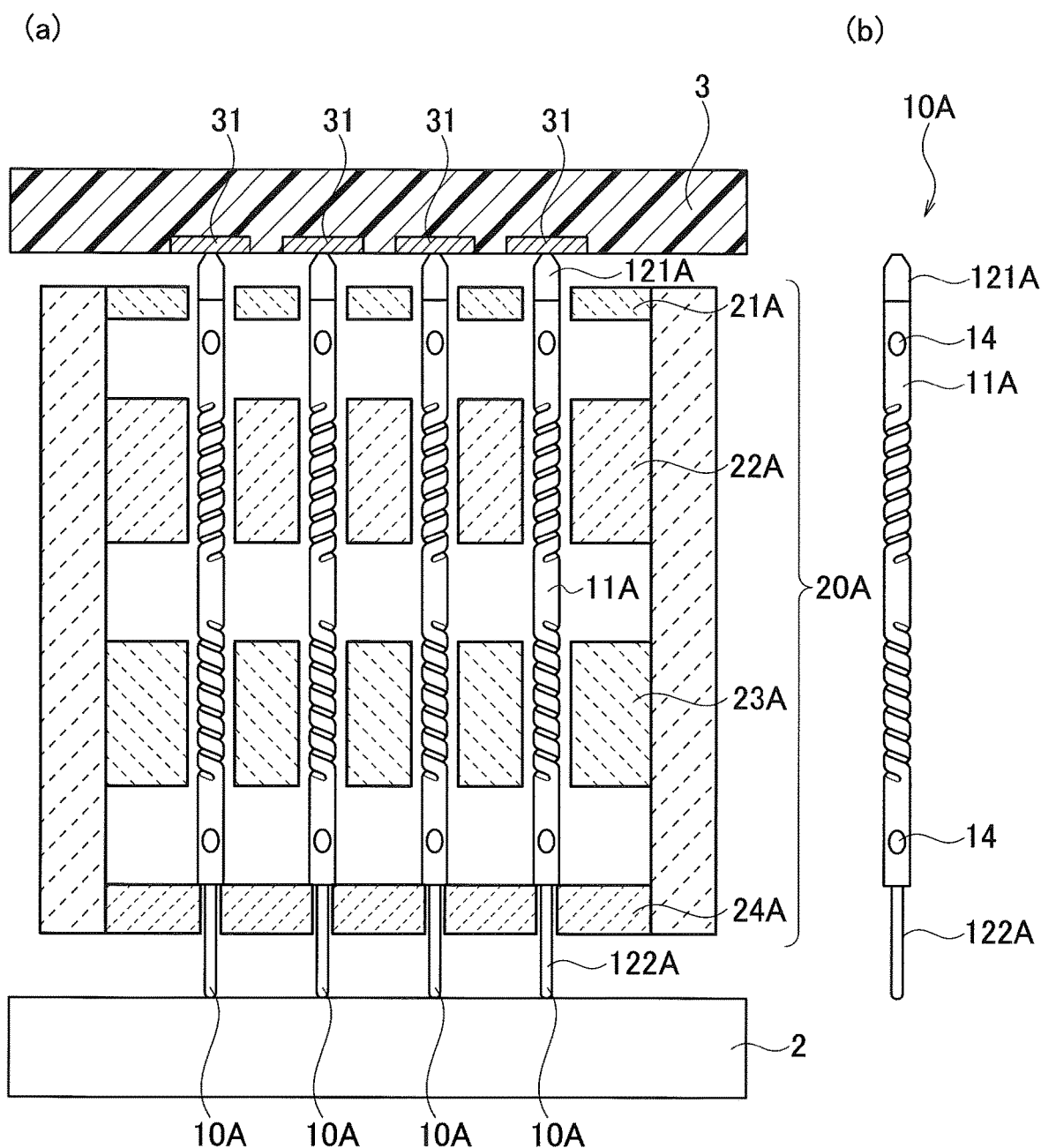
FIGS. 3(a) and 3(b) are schematic views illustrating the configuration of an electric connection device of Comparative Example, FIG. 3(a) illustrating the entire configuration of the electric connection device, FIG. 3(b) illustrating the configuration of a probe.

FIG. 3(a) illustrates an electric connection device of Comparative Example, and FIG. 3(b) illustrates a probe 10A included in the electric connection device of Comparative Example. The probe 10A illustrated in FIG. 3(b) does not include a protrusion on the circumference.

The guide plates of a probe head 20A illustrated in FIG. 3(a) include a top-side guide plate 21A, an upper middle guide plate 22A, a lower middle guide plate 23A, and a bottom-side guide plate 24A. The top-side guide plate 21A is provided in the vicinity of the tips of the top-side plungers 121A of the probes 10A. The upper middle guide plate 22A is provided in the vicinity of the top-side spring sections of the barrels 11A of the probes 10A. The lower middle guide plate 23A is provided in the vicinity of the bottom-side spring sections of the barrels 11A. The bottom-side guide plate 24A is provided in the vicinity of the tips of the bottom-side plungers 122A of the probes 10A.

Compared to the electric connection device of Comparative Example including the probe head 20A that includes the four guide plates as described above, the probe head 20 of the electric connection device illustrated in FIG. 1(a) includes the two guide plates. The electric connection device illustrated in FIG. 1(a) thus requires fewer guide plates than the electric connection device of Comparative Example and can be manufactured at lower cost.

In the electric connection device of Comparative Example illustrated in FIG. 3(a), the lower ends of the barrels 11A of the probes 10A are supported by the bottom-side guide plate 24A of the probe head 20A from below. Part of the tip of the bottom-side plunger 122A exposed from the open end of each barrel 11A therefore penetrates the bottom-side guide plate 24A. This prevents the entire length of each probe 10A from being shortened.

In the electric connection device illustrated in FIG. 1(a), the probes 10 are supported by the probe head 20 through the protrusions 13, and the lower ends of the barrels 11 are not supported by the probe head 20. The tips of the bottom-side plungers 122 are unnecessary to penetrate any guide plates. This allows the entire length of each probe 10 to be shortened.

Furthermore, the electric connection device illustrated in FIG. 1(a) does not need a guide plate supporting the barrels 11 of the probes 10 from below. The height of the probe head 20 in the axial direction of the probes 10 can be therefore reduced. This allows the entire length of each probe 10 to be shortened.

When the maximum current that is allowed to flow through each probe 10 (hereinafter, referred to as allowable current) is small, the limit on current to be applied to the inspection subject 2 is small, thus preventing adequate inspection for the inspection subject 2. However, the allowable current of each probe 10 can be increased when the entire length of the probe 10 is shortened. The thick tips of the bottom-side plungers 122 illustrated in FIG. 1(b) also have advantage to increase the allowable current.

Modification

The number of guide plates of the probe head 20 may be increased when the entire length of each probe 10 is long or when the probes 10 are pressed against the inspection subject 2 or lands 31 and are subjected to strong bending stress.

Figure 4:
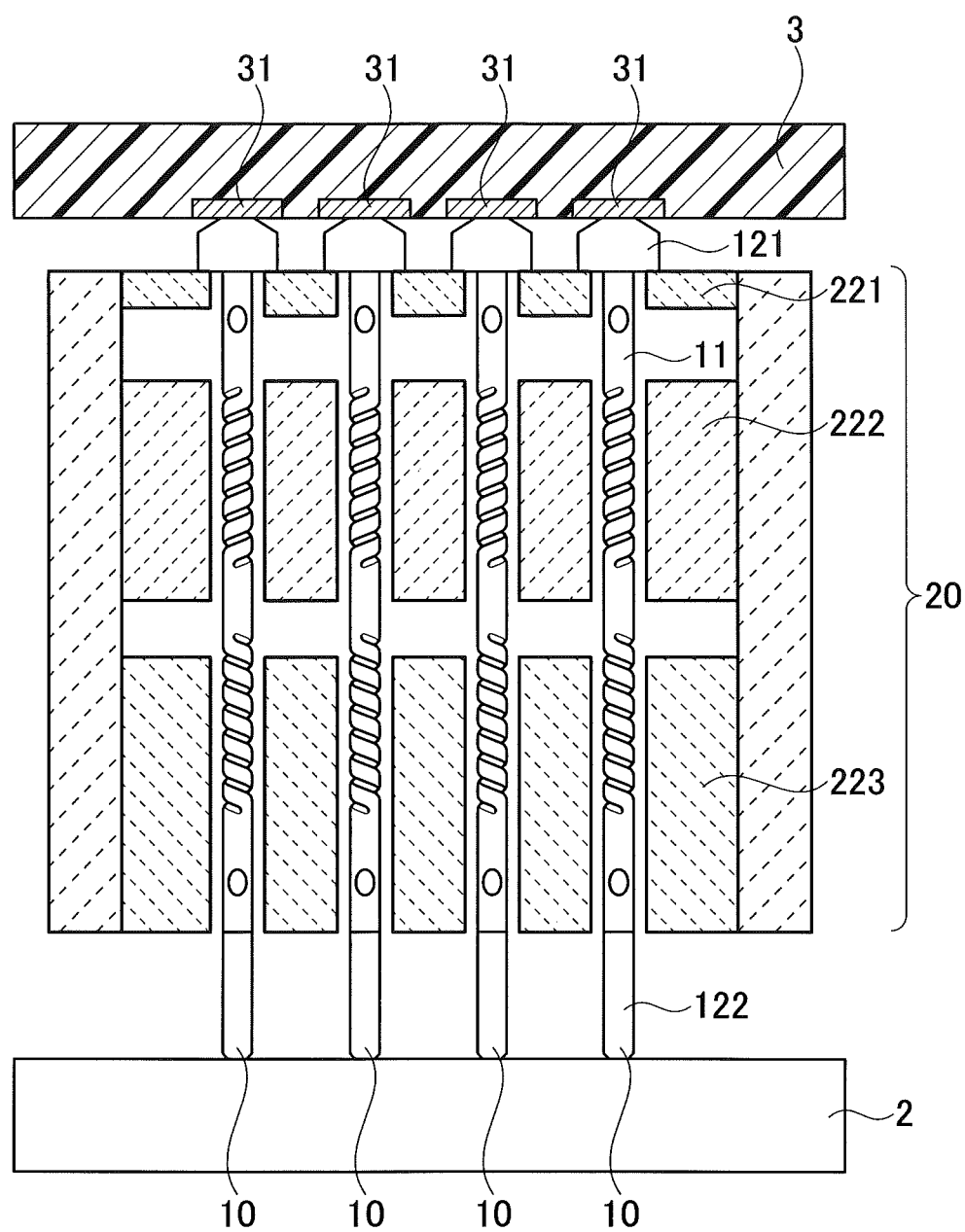
FIG. 4 is a schematic view illustrating the configuration of an electric connection device according to a modification of the first embodiment of the present invention.

For example, a probe head 20 of an electric connection device of a modification illustrated in FIG. 4 includes a guide plate 221 as the support guide plate, a guide plate 222 provided in the vicinity of the top-side spring sections, and a guide plate 223 provided in the vicinity of the bottom-side spring sections. This configuration implements stable measurement of characteristics of the inspection subject 2 even when the entire length of each probe 10 is long, for example.

Second Embodiment

Figure 5:
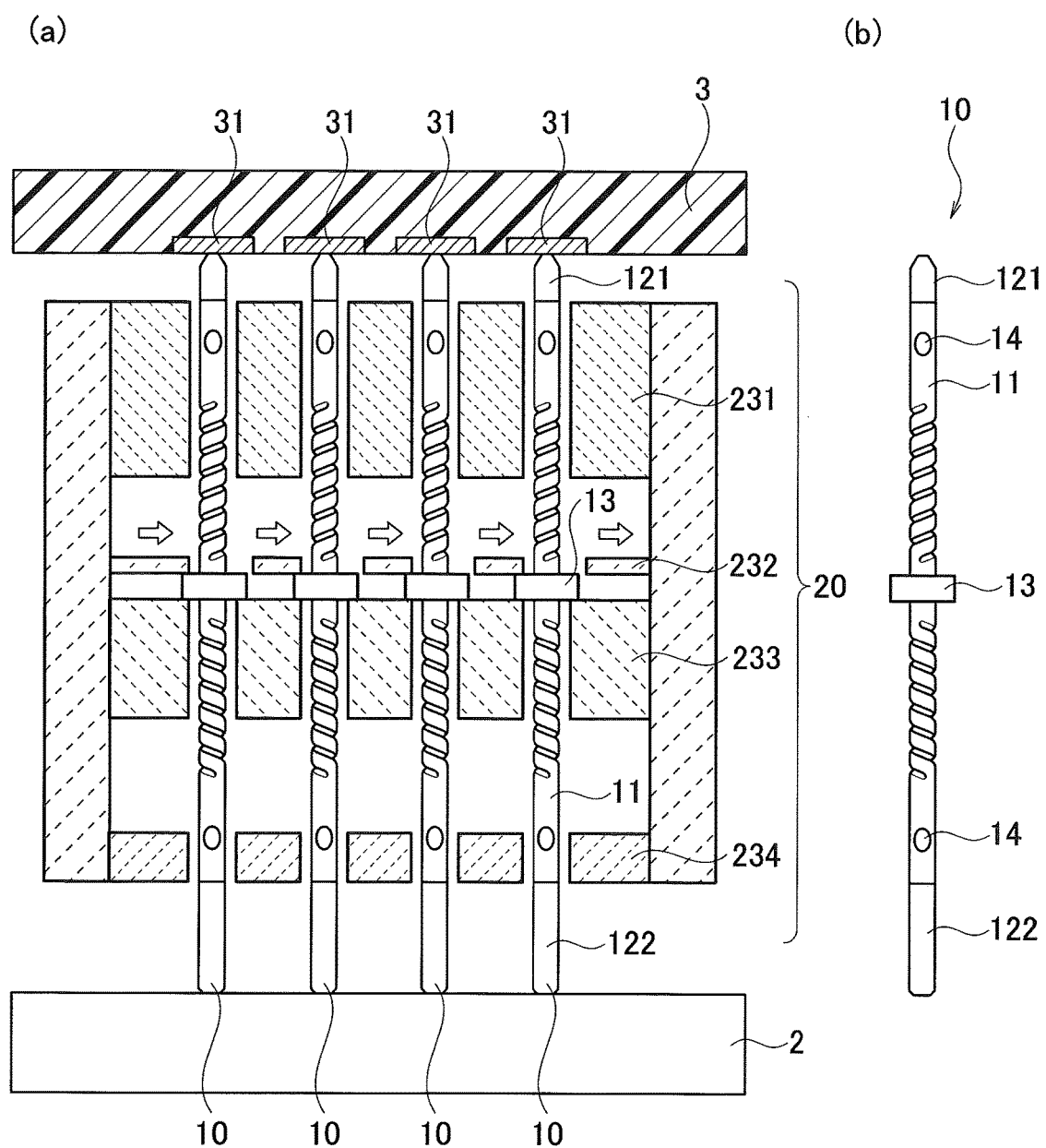
FIGS. 5(a) and 5(b) are schematic views illustrating the configuration of an electric connection device according to a second embodiment of the present invention, FIG. 5(a) illustrating the entire configuration of the electric connection device, FIG. 5(b) illustrating the configuration of a probe.

FIG. 5(a) illustrates an electric connection device according to a second embodiment of the present invention. Each probe 10 used in the electric connection device illustrated in FIG. 5(a) is provided with a flange-like protrusion 13 on the circumference of the barrel 11 as illustrated in FIG. 5(b). The protrusion 13 has an outer diameter greater than that of the body of the barrel 11. The outer diameter of the tip of the top-side plunger 121 is the same as that of the outer diameter of the body of the barrel 11. The electric connection device illustrated in FIG. 5(a) is different from the electric connection device illustrated in FIG. 1(a) in that the probes 10 are supported by the support guide plate at the barrels 11. The other configurations thereof are the same as those of the first embodiment.

As described above, in the probe head 20 illustrated in FIG. 5(a), a guide plate 233 provided in the vicinity of the bottom-side spring sections serves as the support guide plate. Specifically, the probes 10 hang within the probe head 20 with the lower sections of the protrusions 13 of the barrels 11 being in contact with the edges of the upper openings of the respective through holes of the guide plate 233.

The probe head 20 further includes: a guide plate 231 provided in the vicinity of the top-side plungers 121; a guide plate 232 provided above the guide plate 233 with the protrusions 13 interposed therebetween; and a guide plate 234 provided below the guide plate 233. The guide plate 234, which is provided in the vicinity of the ends of the barrels 11 from which the bottom-side plungers 122 are exposed, does not need to be provided when the probes 10 can be held stably during measurement.

In order for the probes 10 to stably come into contact with the inspection subject 2 and lands 31, the magnitudes of the OD and preload need to be within proper ranges. It is therefore preferred that the spring function of the top-side plungers 121 and the spring function of the bottom-side plungers 122 operate independently.

The electric connection device illustrated in FIG. 5(a) therefore includes a stopper guide plate as one of the plural guide plates included in the probe head 20. The stopper guide plate is provided above the support guide plate such that the edges of the lower openings of the through-holes of the stopper guide plate are in contact with the upper sections of the respective protrusions 13. The guide plate 232 illustrated in FIG. 5(a) serves as the stopper guide plate.

In the electric connection device illustrated in FIG. 5(a), the protrusions 13 of the probes 10 are pressed against the support guide plate or stopper guide plate when the probes 10 expand or compress due to the spring function. For example, when the OD applied across the bottom-side plungers 122 and the inspection subject 2 is greater than the preload applied across the top-side plungers 121 and the lands 31, the upper sections of the protrusions 13 are pressed against the edges of the lower openings of the respective through-holes of the stopper guide plate. When the preload is greater than the OD, the lower sections of the protrusions 13 are pressed against the edges of the upper openings of the respective through-holes of the support guide plate.

The expansion and compression of the top-side spring sections and the expansion and compression of the bottom-side spring sections are individually restricted by the protrusions 13 coming into contact with any guide plate. The spring function of the top-side spring sections that affect pressure with which the probes 10 come into contact with the lands 31 and the spring function of the bottom-side spring sections that affects pressure with which the probes 10 come into contact with the inspection subject 2 operate independently.

The preload and OD are therefore applied as intended. The probes 10 stably come into contact with the inspection subject 2 and the lands 31 provided in the substrate 3. It is thus possible to avoid the possibility of damages on the lands 31 or inspection subject 2 due to excessive pressure or the possibility of variation in contact resistance due to unstable contact.

As described above, in the electric connection device according to the second embodiment of the present invention, the protrusions 13 are sandwiched between the support guide plate and the stopper guide plate in the vertical direction. This allows the probes 10 to stably come into contact with the inspection subject 2 and lands 31, thus implementing accurate measurement of characteristics of the inspection subject 2.

Preferably, the diameters of the through-holes of the stopper guide plate are greater than the outer diameters of the protrusions 13. The stopper guide plate is configured to slide along a plane perpendicular to the axial direction of the probes 10 as indicated by arrows in FIG. 5(a) and move to the position where the edges of the lower openings of the through-holes of the stopper guide plate come into contact with the upper sections of the respective protrusions 13.

The configuration of the stopper guide plate sliding as described above facilitates inserting the probes 10 into the probe head 20. In the process of inserting the probes 10 into the probe head 20, the central position of each through-hole of the stopper guide plate is aligned with the central positions of the corresponding through-holes of the other guide plates. After the probes 10 are inserted into the through-holes of the stopper guide plate, the stopper guide plate is slid. When the probes 10 expand or compress in the axial direction, therefore, the upper sections of the protrusions 13 are pressed against the edges of the lower openings of the respective through-holes of the stopper guide plate.

Modification

Figure 6:
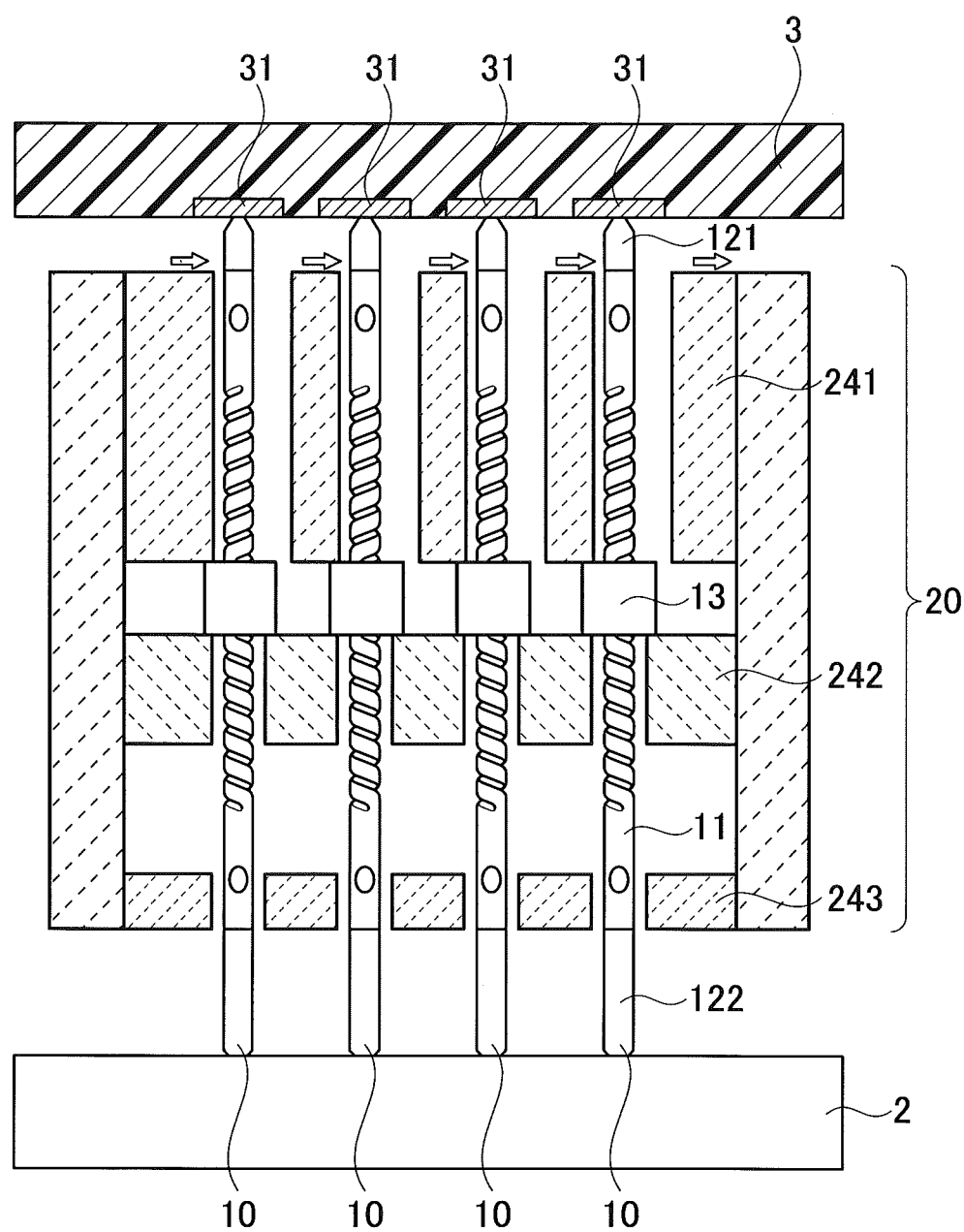
FIG. 6 is a schematic view illustrating the configuration of an electric connection device according to a modification of the second embodiment of the present invention.

FIG. 6 illustrates an electric connection device according to a modification of the second embodiment of the present invention. The probe head 20 illustrated in FIG. 6 includes: a guide plate 241 provided in the vicinity of the top-side spring sections; a guide plate 242 provided in the vicinity of the bottom-side spring sections; and a guide plate 243 provided in the vicinity of the ends of the barrels 11 from which the bottom-side plungers 122 are exposed.

In the electric connection device illustrated in FIG. 6, the guide plate 241 serves as the stopper guide plate, and the guide plate 242 serves as the support guide plate. The stopper guide plate is the highest among the plural guide plates stacked in the axial direction of the probes 10.

As indicated by arrows in FIG. 6, the guide plate 241 may be configured to slide. This facilitates inserting the probes 10 into the probe head 20 as described above.

The electric connection device illustrated in FIG. 6 requires fewer guide plates than the electric connection device illustrated in FIG. 5(a). Furthermore, the guide plate 243 does not need to be provided when the probes 10 are stably held during measurement.

According to the electric connection device illustrated in FIG. 6, the support and stopper guide plates are thick. This can reduce bending of the upper surfaces of the guide plates swelling due to preload.

Figure 7:
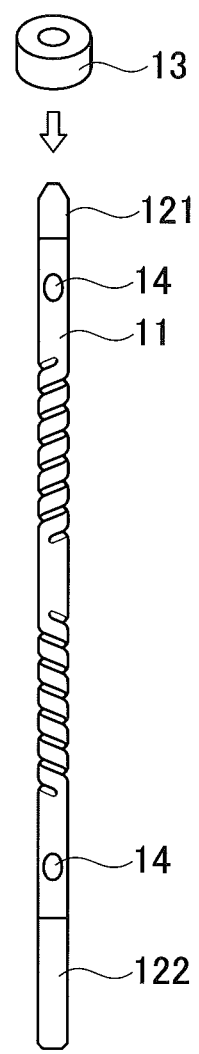
FIG. 7 is a schematic view illustrating a method example of providing a protrusion for each probe of the electric connection device according to the second embodiment of the present invention.

Each of the probes 10 illustrated in FIGS. 5(a) or 6 can be manufactured by fitting the protrusion 13, which is ring-shaped, on the barrel 11 as illustrated in FIG. 7, for example. The flange-like protrusion 13 is thereby provided on the circumference of the barrel 11.

Figure 8:
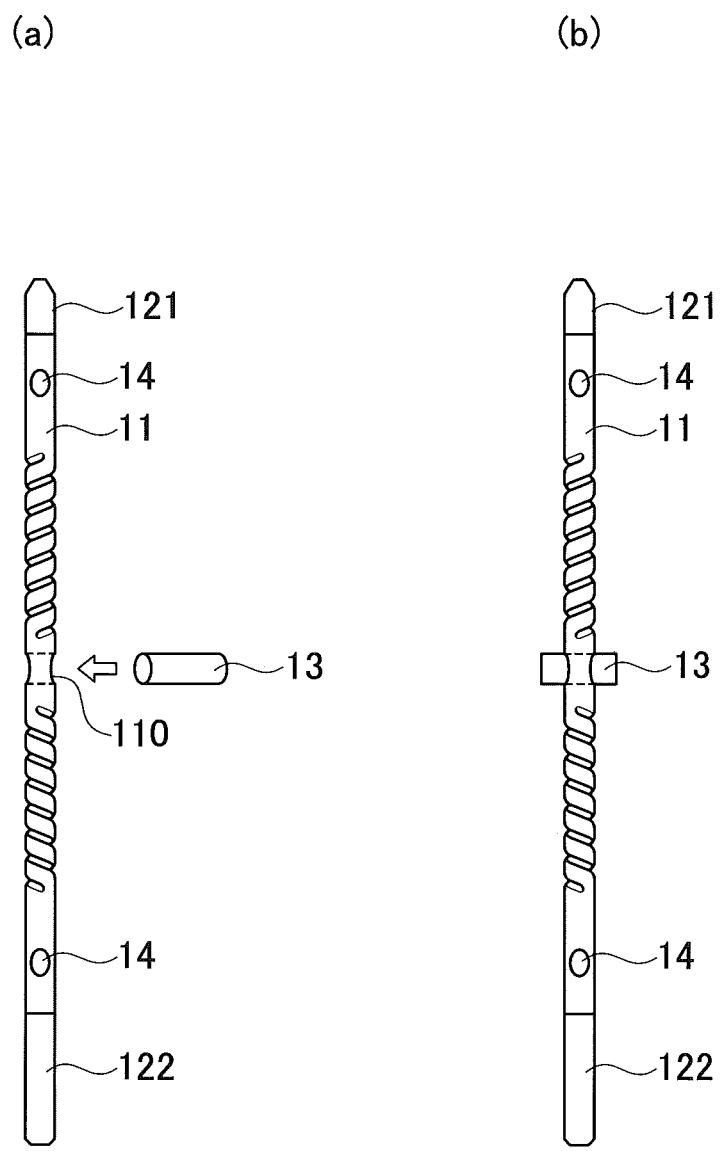
FIGS. 8(a) and 8(b) are schematic views illustrating another method example of providing a protrusion for each probe of the electric connection device according to the second embodiment of the present invention, FIG. 8(a) illustrating the method of providing the protrusion, FIG. 8(b) illustrating the state where the protrusion is provided.

Alternatively, as illustrated in FIG. 8(a), a through-hole 110 is formed in the body of the barrel 11 so as to extend perpendicularly to the axial direction, and the protrusion 13 is rod-like and is inserted into the through-hole 110 as indicated by an arrow. The protrusion 13 is thereby provided on the circumference of the barrel 11 as illustrated in FIG. 8(b). The through-hole 110 is formed between the top- and bottom-side spring sections, for example.

Other Embodiment

The present invention is explained through the embodiments as described above. However, it should not be understood that the description and drawings constituting a part of the disclosure limits the present invention. This disclosure will reveal various substitutions, examples, and operation techniques for those skilled in the art.

For example, each probe 10 may have a circular cross-sectional shape or may have a polygonal cross-sectional shape, such as a rectangular shape.

It is certain that the present invention includes various embodiments not described herein and the like.

INDUSTRIAL APPLICABILITY

The electric connection devices according to the embodiments are applicable to the field of electric characteristic measurements of inspection subjects.

The invention claimed is:

1. An electric connection device, comprising:
  a probe including: a tubular barrel; a rod-like top-side plunger; and a rod-like bottom-side plunger, the top- and bottom-side plungers being connected to the barrel with tips thereof exposed from respective open ends of the barrel;
  a probe head including a plurality of guide plates which are spaced apart from each other in the axial direction of the probe and each include a through-hole through which a body of the barrel penetrates, wherein
  a protrusion having an outer diameter greater than the body of the barrel is provided on the circumference of the probe,
  the plurality of guide plates include a support guide plate in which the through-hole has a diameter smaller than the outer diameter of the protrusion,
  the probe is supported by the support guide plate with the top-side plunger up such that a lower section of the protrusion is in contact with an edge of an upper opening of the through-hole of the support guide plate,
  the protrusion is provided on the circumference of the barrel, and
  the plurality of guide plates include a stopper guide plate which is provided above the support guide plate, and an edge of a lower opening of the through-hole of the stopper guide plate is in contact with an upper section of the protrusion.

2. The electric connection device according to claim 1, wherein the lower end of the barrel is not supported by the probe head from below.

3. The electric connection device according to claim 1, wherein
  the through-hole of the stopper guide plate has a diameter greater than the outer diameter of the protrusion,
  the stopper guide plate slides along a plane perpendicular to the axial direction of the probe and moves to a position where the edge of the lower opening of the through-hole of the stopper guide plate comes into contact with the upper section of the protrusion.

4. The electric connection device according to claim 1, wherein the stopper guide plate is the highest among the plurality of guide plates stacked in the axial direction of the probe.

5. The electric connection device according to claim 1, wherein
  the probe is configured to freely expand and compress in the axial direction thereof, and
  the protrusion is pressed against the edge of the upper opening of the through-hole of the support guide plate or the edge of the lower opening of the through-hole of the stopper guide plate when the probe expands or compresses in the axial direction.

6. The electric connection device according to claim 5, wherein the barrel is configured to freely expand or compress due to a spring section including a spiral cut formed in the side surface.

7. The electric connection device according to claim 1, wherein the outer diameter of the tip of the bottom-side plunger exposed to the outside of the barrel is greater than the section of the bottom-side plunger inserted within the barrel.

\* \* \* \* \*